(12) United States Patent
Chen et al.

(10) Patent No.: US 7,919,412 B2
(45) Date of Patent: *Apr. 5, 2011

(54) OVER-PASSIVATION PROCESS OF FORMING POLYMER LAYER OVER IC CHIP

(75) Inventors: Ying-Chih Chen, Tainan County (TW); Mou-Shiung Lin, Hsinchu (TW); Chiu-Ming Chou, Kaohsiung (TW)

(73) Assignee: Megica Corporation, Hsinchu (TW)

( * ) Notice: Subject to any disclaimer, the term of this patent is extended or adjusted under 35 U.S.C. 154(b) by 33 days.

This patent is subject to a terminal disclaimer.

(21) Appl. No.: 12/273,546

(22) Filed: Nov. 19, 2008

(65) Prior Publication Data

US 2009/0111261 A1   Apr. 30, 2009

Related U.S. Application Data

(63) Continuation of application No. 11/183,658, filed on Jul. 18, 2005, now Pat. No. 7,592,205.

(30) Foreign Application Priority Data

Jul. 16, 2004  (TW) ................................ 93121260 A

(51) Int. Cl.
      *H01L 21/00*    (2006.01)
(52) U.S. Cl. .................................. 438/678; 257/E21.496
(58) Field of Classification Search .................. 438/622; 257/E21.495

See application file for complete search history.

(56) References Cited

U.S. PATENT DOCUMENTS

| | | | |
|---|---|---|---|
| 4,980,034 A | 12/1990 | Volfson | |
| 5,077,100 A | 12/1991 | Miracky | |
| 5,106,461 A | 4/1992 | Volfson | |
| 5,242,864 A | 9/1993 | Fassberg | |
| 5,342,495 A | 8/1994 | Tung | |
| 5,384,488 A | 1/1995 | Golshan | |
| 5,569,956 A | 10/1996 | Chillara | |
| 5,827,778 A * | 10/1998 | Yamada | ........................ 438/637 |
| 5,854,740 A | 12/1998 | Cha | |
| 5,969,424 A | 10/1999 | Matsuki | |
| 6,066,877 A | 5/2000 | Williams | |

(Continued)

FOREIGN PATENT DOCUMENTS

TW  108345  12/1987

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Thao P. Le
(74) *Attorney, Agent, or Firm* — McDermott Will & Emery LLP

(57) ABSTRACT

A method for forming a semiconductor chip or wafer includes following steps. A semiconductor substrate is provided, and then a polymer layer is deposited over the semiconductor substrate, wherein the polymer layer comprises polyimide. The polymer layer with a temperature profile having a peak temperature between 200 and 320 degrees Celsius. Alternatively, the temperature profile may comprises a period of time with a temperature higher than 320 degree Celsius, wherein the period of time is shorter than 45 minutes.

20 Claims, 6 Drawing Sheets

U.S. PATENT DOCUMENTS

| | | |
|---|---|---|
| 6,187,680 B1 | 2/2001 | Costrini |
| 6,229,221 B1 | 5/2001 | Kloen |
| 6,300,234 B1 | 10/2001 | Flynn |
| 6,365,968 B1 | 4/2002 | Qian |
| 6,383,916 B1 | 5/2002 | Lin |
| 6,410,435 B1 | 6/2002 | Ryan |
| 6,476,506 B1 | 11/2002 | O'Connor |
| 6,476,507 B1 | 11/2002 | Takehara |
| 6,593,222 B2 | 7/2003 | Smoak |
| 6,605,528 B1 | 8/2003 | Lin |
| 6,620,728 B2 * | 9/2003 | Lin ................................ 438/637 |
| 6,683,380 B2 | 1/2004 | Efland |
| 6,756,295 B2 | 6/2004 | Lin |
| 6,798,050 B1 | 9/2004 | Homma |
| 6,800,555 B2 | 10/2004 | Test |
| 6,844,631 B2 | 1/2005 | Yong |
| 6,979,647 B2 | 12/2005 | Bojkov |
| 7,060,607 B2 | 6/2006 | Efland |
| 7,064,368 B2 | 6/2006 | Tanaka et al. |
| 7,592,205 B2 * | 9/2009 | Chen et al. .................... 438/127 |
| 2001/0035452 A1 | 11/2001 | Test |
| 2001/0051426 A1 | 12/2001 | Pozder |
| 2002/0000671 A1 | 1/2002 | Zuniga |
| 2002/0043723 A1 | 4/2002 | Shimizu |
| 2003/0199159 A1 | 10/2003 | Fan et al. |
| 2004/0070042 A1 | 4/2004 | Lee |
| 2008/0050909 A1 | 2/2008 | Lin et al. |

FOREIGN PATENT DOCUMENTS

| | | |
|---|---|---|
| TW | 353260 | 2/1999 |
| TW | 505502 | 10/2002 |
| TW | 525284 | 3/2003 |
| TW | 529113 | 4/2003 |
| TW | 543216 | 7/2003 |
| TW | 544747 | 8/2003 |
| TW | 558782 | 10/2003 |
| TW | 558835 | 10/2003 |
| TW | 560018 | 11/2003 |
| TW | 564530 | 12/2003 |
| TW | 587316 | 5/2004 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th.International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-.State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking.Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post.Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology ™ - MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

US 7,919,412 B2

OVER-PASSIVATION PROCESS OF FORMING POLYMER LAYER OVER IC CHIP

This application is a continuation of application Ser. No. 11/183,658, filed on Jul. 18, 2005 now U.S. Pat. No. 7,592,205, now pending, which claims the priority benefit of Taiwan application Ser. No. 93121260, filed on Jul. 16, 2004.

BACKGROUND OF THE INVENTION

1. Field of the Invention

The invention relates to the over-passivation process. More particularly, the invention relates to the over-passivation process that is advantageous to apply the curing process of polyimide material at low temperature.

2. Description of the Related Art

In recent years, with the advancement and development of the process of semiconductor fabrication techniques, many kinds of high performance electronic product are produced daily, and the level of integration of semiconductor integrated circuits (IC) is higher and higher. Before IC chips become usable products, they need to be packaged with sufficient protection from damage and electrical connection linking a chip to other devices or print circuit boards. Thus, IC packaging plays an important role to the ultimate performance of IC chips.

The typical electrical connection in IC package process can be classified into wire bonding package (WB), tape automatic bonding (TAB) and flip chip (FC), etc. And each of these packages has its' own characteristics and application field.

It is to be noted that no matter what kind of the above package be used, an IC chip is typically mounted on a carrier. In order to transmit signals, the pads on the carrier must be electrically connected to the pads on the chip; the carrier can be a lead frame or a ball grid array (BGA) substrate. It should be noted that the pads on the chips can form various kinds of layout and each kind of the layout should be compatible with that of the carrier. In most practical cases, one kind of pad layout can be utilized only for one carrier but not for the others. From time to time IC design engineer needs to utilize a redistribution circuitry to accommodate the layouts of two different connecting structures on the IC and the carriers regardless of the IC chip may bear the very same functionality. It is this redistribution circuitry that has to do with the intermetallic compound of two metal systems lying at the interface between the redistribution circuitry and an IC pad.

FIGS. 1A and 1B are cross-sectional representations of a conventional over-passivation process. As shown in FIG. 1A, a semiconductor wafer 100 comprises a substrate 110, an aluminum (Al) pad 120, a passivation layer 130, a first polyimide layer 140, an adhesion/barrier layer 150, a gold (Au) circuitry 160 and a second polyimide layer 170. The substrate 110 may comprise a silicon base and an interconnecting metallization structure, the interconnecting metallization structure being over the silicon base. Multiple electronic devices formed in or on the silicon base can be, for example, transistors, MOS transistors or passive devices. They are electrically connected to the aluminum pad 120 through circuit lines in the interconnecting metallization structure. Moreover, the aluminum pad 120 is placed over the substrate 110 and covered by the passivation layer 130, with an opening in the passivation layer 130 exposing the aluminum pad 120. In addition, the first polyimide layer 140 is placed over the passivation layer 130 and has an opening exposing the aluminum pad 120. Furthermore, an adhesion/barrier layer 150 is placed on the first polyimide layer 140 and aluminum pad 120, which is subsequently covered by a gold layer 160. A second polyimide layer 170 is deposited on the gold layer 160. Thereafter, semiconductor wafer 100 is separated into multiple semiconductor chips by a cutting process.

As shown in FIG. 1B, during the curing process of the second polyimide layer 170, attributed to its high curing temperature, which is often higher than 350° C., and the elongated process time, about several hours, such a process could lead to the inter-diffusion phenomenon of Al and Au penetrating through the diffusion barrier layer 150. If the adhesion/barrier layer 150 is too thin, eventually Au and Al will meet each other, and then an aluminum-gold inter-metallic compound (IMC) 180 will be formed at the interface of gold circuit 160 and adhesion/barrier layer 150. It should be noted that the aluminum-gold inter-metallic compound 180 is a porous structure; it not only weakens the mechanical integrity of the jointing structure, but also deteriorates the quality of electrical signal passing therethrough. To prevent such an aluminum-gold inter-metallic compound from occurrence, prior arts seek to increase the thickness of adhesion-barrier layer 150 or dope foreign ions or atoms into the adhesion-barrier layer 150. Regardless of which of the above process used, they both will increase the cost of production. Also, the quality of the electrical signal passing therethrough will be deteriorated in that a thickened or doped barrier layer 150 increases its parasitic resistance.

The other disadvantage of the high temperature curing process of polyimide layers lies on its impact on the thermal budget of IC manufacturing process. Because traditional curing process of polyimide layer is run at high temperature for several hours, and there may be multiple polyimide layers deposited over the semiconductor wafer, the curing process of polyimide will inevitably suppress the whole thermal budget to manufacture the semiconductor wafer 100. It is the trend of today's semiconductor fabrication process to lower the thermal budget since high temperature processes usually cause problems on the issues such as the formation of inter-metallic compound, diffusion among different layers, and exceeded thermal stress caused by the different thermal expansion coefficient of materials, etc. Take metal oxide semiconductor (MOS) as an example, the doped region (i.e. either the n-doped or p-doped area) will be expanded at high temperature process. The resulted expansion of the doped region may cause the side effect of gate channel shortening or the concentration profile change of the doped area.

SUMMARY OF THE INVENTION

The main objective of the invention is to provide a over-passivation layer manufacturing process that can lower the thermal budget of the semiconductor manufacturing process.

Yet another objective of the invention is to provide a over-passivation layer manufacturing process that can reduce, or even totally eliminate, the occurrence of the inter-metallic compound.

Yet another objective of the invention is to provide a process to form polymer layer over the IC chip that has the efficacy to relax the thermal budget of IC manufacturing process.

In accordance with the above objectives, the invention provides a over-passivation process that comprises the following steps. First, we provide an IC chip that comprises at least one connection pad and one passivation layer, in which the passivation layer has at least one opening, exposing the connection pad. Secondly, we form a patterned metal circuit layer and a polymer layer over the passivation layer. The material used for forming the polymer layer comprises polyimide, in which the formation process comprises the following steps. First, form an imide-oligomer layer over the passivation layer. Secondly, heat the imide-oligomer layer to a temperature below 320° C. to cure it into a polyimide layer.

In accordance with the objectives of the invention, the preferred embodiment of the imide-oligomer deposition process is a spin-on coating process; the imide-oligomer layer is deposited over IC passivation layer.

Also in according with the objectives of the invention, the thickness of the polymer layer is thicker than 1 micrometer after cured and that of the patterned metal circuit layer is also thicker than 1 micrometer.

Also in accordance with the objectives of the invention, the steps of forming the patterned metal circuit layer comprise forming an adhesion-barrier layer over the connection pad and the passivation layer. A gold layer is subsequently formed over the adhesion-barrier layer. The gold layer and adhesion-barrier layer is patterned thereafter. The material used for adhesion/barrier layer can be titanium-tungsten alloy, tantalum, tantalum nitride or titanium.

Also in accordance with the objectives of the invention, the steps of forming the patterned metal circuit layer comprises one that forms an adhesion-barrier layer over the connection pad and passivation layer; a copper layer is formed over the adhesion-barrier layer subsequently. Yet in a further formation process, the steps of forming the patterned metal circuit layer further comprise step of forming a nickel (Ni) layer over the copper (Cu) layer. Yet the further steps of forming the patterned metal circuit layer comprise the steps of forming a gold layer over the nickel (Ni) layer. Moreover, the structure of adhesion-barrier layer can be a composite layer overlaid by a titanium layer and a titanium-tungsten alloy layer, or by chromium layer and a chromium-copper alloy layer.

Also in accordance with the objectives of the invention, the main body of the patterned metal circuit layer is aluminum.

Also in accordance with the objectives of the invention, the main body of the patterned metal circuit layer under the passivation layer is copper, or electroplated copper, or damascene copper. Over the copper pad, the steps of forming the polyimide layer and patterned metal circuit layer comprise forming a polyimide layer at low curing temperature, forming an adhesion-barrier layer over the polyimide layer and passivation layer, and then forming a gold or copper layer over the adhesion-barrier layer subsequently.

Also in accordance with the objectives of the invention, the main body of the patterned metal circuit layer under the passivation layer is copper, or electroplated copper, or damascene copper. In most applications, an aluminum cap layer is formed over the copper pad Over the aluminum metal cap, the steps of forming the polyimide layer and patterned metal circuit layer comprise forming a polyimide layer at low curing temperature, forming an adhesion-barrier layer over the polyimide layer and passivation layer, and then forming a gold or copper layer over the adhesion-barrier layer subsequently.

Also in accordance with the objectives of the invention, the over-passivation process comprises steps of first forming a patterned metal circuit layer over the passivation layer, subsequently forming a polymer layer over the patterned metal circuit layer.

Also in accordance with the objectives of the invention, the over-passivation process comprises steps of forming polymer layer over the passivation layer.

Also in accordance with the objectives of the invention, the over-passivation process comprises steps of first forming polymer layer over the passivation layer, subsequently forming a patterned metal circuit layer over the polymer layer.

Also in accordance with the objectives of the invention, the thickness of passivation layer is thicker than 0.35 micrometer. Besides, the structure of passivation layer is a composite one that comprises a silicon nitride layer with thickness greater than 0.35 micrometer, a silicon oxide layer, a phosphorus silicon glass layer, or at least one of the above.

Also in accordance with the objectives of the invention, the material used for the connection pad is aluminum.

Also in accordance with the objectives of the invention, the material used for the connection pad is copper.

In accordance with the above objectives or other objectives, the invention discloses an over-passivation process that comprises the following steps. First, provide a chip that comprises at least a connection pad and a passivation layer with an opening that has the connection pad exposed. Then form a first patterned metal circuit layer over the passivation layer. Following this metal formation process, form a patterned polymer layer over the first patterned metal circuit. The material used for the patterned polymer layer comprises polyimide. The steps for forming the patterned polymer layer comprise forming an imide-oligomer layer over the first patterned metal circuit layer. The subsequent steps comprise heating the imide-oligomer layer to a temperature below 320° C. to cure the imide-oligomer layer to a solid polymer film. The proceeding process steps comprise patterning the cured polymer film to form multiple openings or other features. The subsequent steps comprises forming a second patterned metal circuit over the patterned polymer layer, and the second patterned metal circuit layer is electrically connected to the first patterned metal circuit layer through the multiple openings depicted above.

Also in accordance with the objectives of the invention, the over-passivation process comprises the method of spin-on coating the imide-oligomer layer over the first patterned metal circuit layer. Besides, the thickness of patterned polymer layer after curing is thicker than 1 micrometer.

According to the above objectives or other objectives, the invention proposed a process that forms a polymer layer on chip. And it comprised the following steps. First, a chip is provided with at least comprised a connection pad and a passivation layer in which there is an opening that leave the connection pad exposed. Then, an imide-oligomer layer is formed on passivation layer. Following with heating of the imide-oligomer layer to the temperature below 320° C. to cure the imide-oligomer layer and make it becomes a solid polymer layer. And materials used for the solid polymer layer comprise polyimide.

Also according to the objectives of the invention, the process of formation of a polymer layer on chip adopts the method of spin-on coating to form the imide-oligomer layer on passivation layer. Besides, the thickness of solid polymer layer is large than 1 micrometer.

According to the above objectives or other objectives, the invention proposed an over-passivation process in which comprise the following steps. First, a chip is provided with at least comprised a connection pad and a passivation layer in which there is an opening that leave the connection pad exposed. And the materials used for connection pad comprise aluminum. Then an adhesion-barrier layer is formed on passivation layer, and the adhesion-barrier layer is electrically connected to the connection pad. Following with forming a gold layer on adhesion/barrier layer, and the thickness of gold layer is larger than 1 micrometer. After the formation of gold layer, a first polymer layer is formed on passivation layer, and the materials used for first polymer layer comprises polyimide. The steps that form first polymer layer comprise first a first imide-oligomer layer is formed on passivation layer, and following with heating the first imide-oligomer layer to the temperature above 200° C. but below 320° C. to cure the first imide-oligomer layer.

Also according to the objectives of the invention, the over-passivation process adopts the method of spin-on coating to form imide-oligomer layer on passivation layer. Besides, the thickness of solid polymer layer is large than 1 micrometer. Also, the material used for adhesion-barrier layer can be titanium-tungsten alloy, tantalum, tantalum nitride or titanium.

Also according to the objectives of the invention, the over-passivation process comprised formation of a second polymer layer on passivation layer, and adhesion-barrier layer and gold layer are formed on the second polymer layer. In which the steps that forming second polymer layer on passivation layer comprise is first forming a second imide-oligomer layer on passivation layer, then following with heating the second imide-oligomer layer to the temperature above 200° C. but below 320° C. to cure the second imide-oligomer layer.

Also according to the objectives of the invention, the over-passivation process comprises formation of a second polymer layer on passivation layer, and formation of adhesion-barrier layer and gold layer on the second polymer layer. The steps that forms the second polymer layer on the passivation layer comprise first forming a second imide-oligomer layer on passivation layer, heating the second imide-oligomer layer to a temperature between 200° C. and 320° C. to cure the second imide-oligomer layer.

Also in accordance with the objectives of the invention, the thickness of passivation layer is thicker than 0.35 micrometer. The structure of passivation layer is a composite one that comprises a silicon nitride layer, a silicon oxide layer, a phosphorus silicon glass layer or at least one of the above.

Also in accordance with the objectives of the invention, a low temperature cured polyimide is used as a stress release buffer layer for the subsequent packaging process, or used for preventing alpha particle penetration. No further layers are deposited over the polyimide layer. The low-temperature curing of polyimide is preferred in tight thermal budget of the sub-micrometer or sub-hundred-nanometer IC process.

In summary, the invented over-passivation process uses a temperature below 320° C. to cure the patterned polymer layer. Thus, it can reduce the occurrence of the inter-metallic compound. The other advantage of the invented over-passivation process lies on the alleviation of the thermal budget of the entire IC manufacturing process, which in turn helps solve other problems caused by high temperature process.

DESCRIPTION OF THE PREFERRED EMBODIMENTS

First Embodiment

Figure 1A:
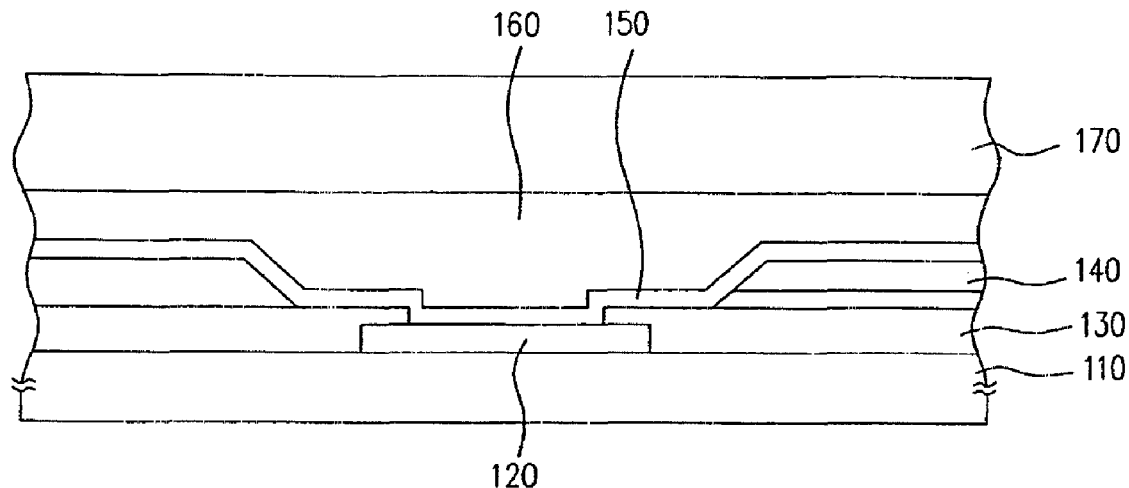
FIGS. 1A and 1B are cross-sectional representations of semiconductor chips formed by a conventional process.
Figure 1B:
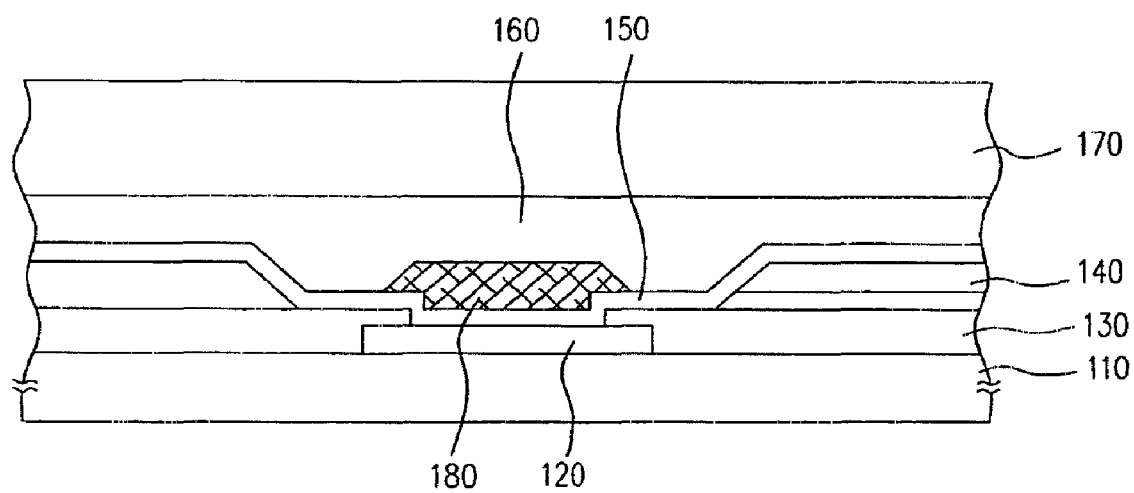
Figure 2A:
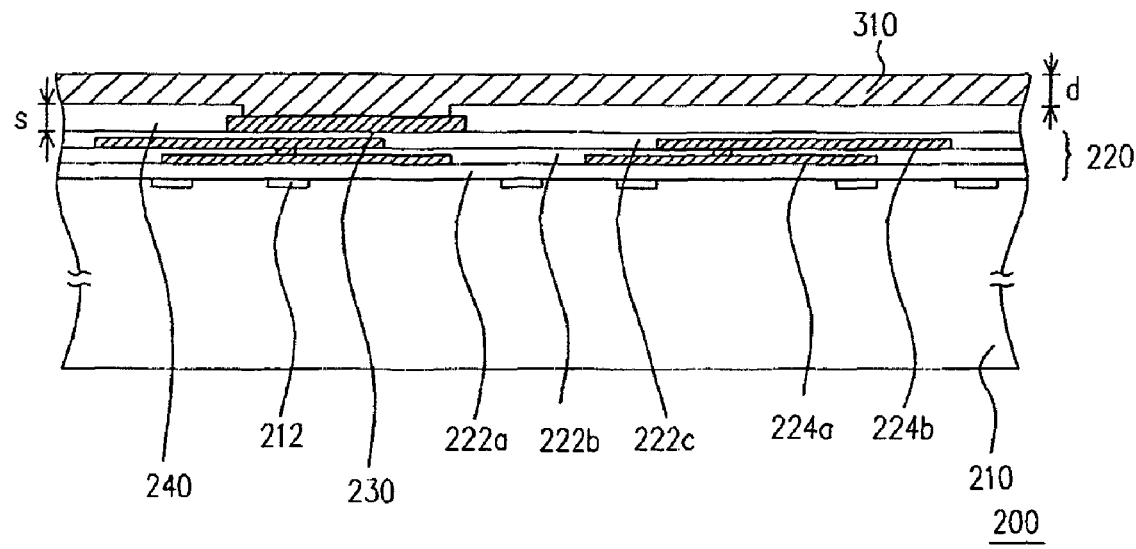
FIGS. 2A through 2C are cross-sectional representations of semiconductor chips formed by the invented process according to the first preferred embodiment of the present invention.
Figure 2B:
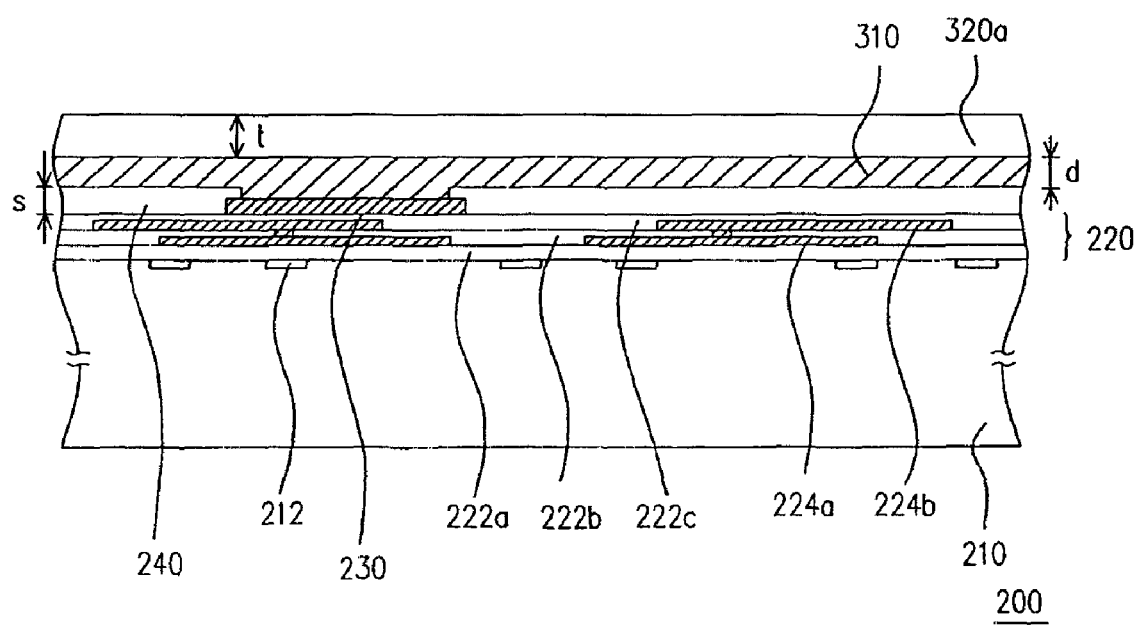
Figure 2C:
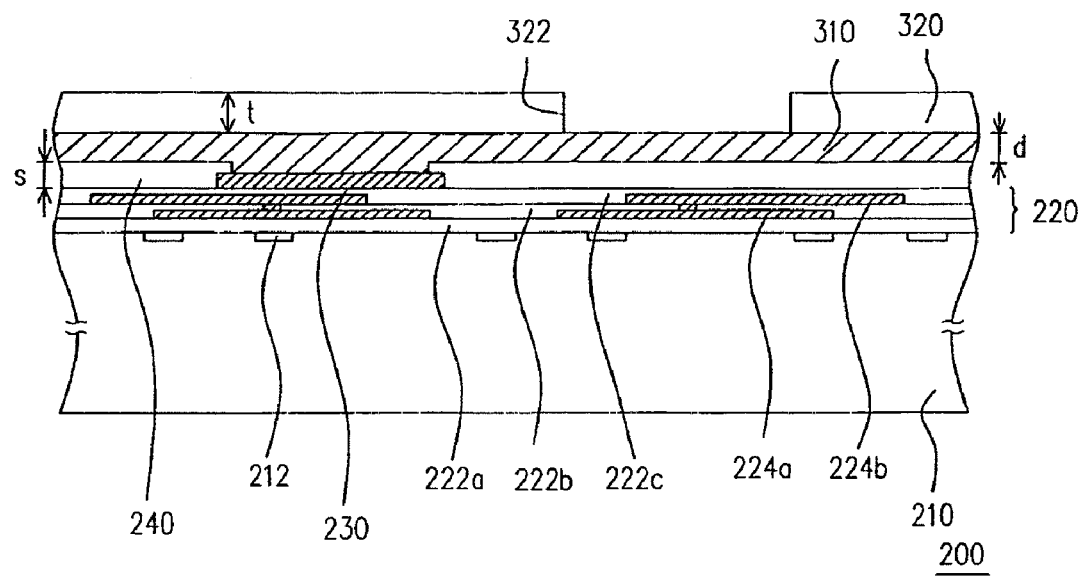

FIGS. 2A through 2C are cross-sectional representations of a over-passivation process of first preferred embodiment of the present invention. As shown in FIG. 2A, the over-passivation process comprises the following steps. First, a semiconductor wafer 200 is provided, wherein the semiconductor wafer 200 comprises a silicon substrate 210, an interconnection structure 220, a connection pad 230, and a passivation layer 240. The silicon substrate 210 has multiple active semiconductor devices composed of either transistors or MOS transistors, or both, even plus passive devices. Multiple electronic devices formed in or on the silicon substrate can be, for example, bipolar transistors, MOS transistors or passive devices. The electronic devices are the sub-micrometer devices, such as 0.18 micrometer, 0.13 micrometer or 0.11 micrometer CMOS devices, or sub-hundred-nanometer devices, such as 90 nanometer, 65 nanometer or 35 nanometer devices. The electronic devices 212 are placed in and on the silicon substrate 210. The interconnection structure 220 is placed over the silicon substrate 210 and electrically connected to these electronic devices 212. The connection pad 230 is placed over the interconnection structure 220, and is electrically connected to the electronic devices 212 through the interconnection structure 220. The material used for pad 230 is typically copper or aluminum. Furthermore, the passivation layer 240 comprises an opening, which leaves the connection pad 230 exposed, and the thickness s of passivation layer 240 is thicker than 0.3 micrometer. The passivation layer 240 is a composite layer, which comprises a silicon nitride layer, a silicon oxide layer, a phosphorous silicon glass layer, or at least one of the above. For example, the passivation layer 240 is formed by depositing a silicon-oxide layer with a thickness of between 0.1 and 0.8 micrometers using a CVD process and then depositing a silicon-nitride layer with a thickness of between 0.2 and 1.2 micrometers over the silicon-oxide layer using a CVD process. Generally, the passivation layer 240 comprises a topmost silicon-nitride layer or a topmost silicon-nitride layer in the finished semiconductor wafer of chip. The passivation layer 240 comprises a topmost CVD insulating layer in the finished semiconductor wafer of chip. The passivation layer 240 prevents the penetration of mobile ions, such as sodium ions, moisture, transition metals, such as gold, silver, copper, and so on, and other contaminations. The passivation layer 240 is used to protect the underlying devices, such as transistors, MOS devices, polysilicon resistors, poly-to-poly capacitors, and fine-line metal interconnections.

The interconnection structure 220 mentioned above comprises dielectric layers 222a and 222b, and circuit layers 224a and 224b. The circuit layers 224a and 224b are deposited on the dielectric layers 222a and 222b, respectively. The circuit layer 224a and 224b are electrically connected to each other and further connected to electronic devices 212 and connection pad 230.

As is shown in FIG. 2A, a patterned metal circuit layer 310 is formed over the connection pad 230 and the passivation layer 240. The thickness of the patterned metal circuit layer 310 is thicker than 1 micrometer. As shown in FIG. 2B, a polymer layer 320a is formed over the patterned metal circuit layer 310 and the passivation layer 240; the material used to form the polymer layer 320a comprises polyimide; the thickness t of the polymer layer 320a is thicker than 1 micrometer, and preferably between 2 micrometers and 10 micrometers. Besides, the steps which form the polymer layer 320a comprise forming an imide-oligomer layer, i.e. precursor layer, on the passivation layer 240 using a spin-on-coating process, followed by heating the imide-oligomer layer upto a temperature between 200° C. and 320° C. for more than 20 minutes and, preferably, between 240° C. and 300° C. for more than 1 hour or for more than 2 hours to cure the imide-oligomer layer.

FIG. 2C is an illustration of patterning process of polymer layer 320. It should be noticed that if the imide-oligomer layer comprises photo-sensitive ingredients, the imide-oligomer layer can be patterned (as shown in FIG. 2B) directly by a photolithography process. If the imide-oligomer layer only contains non-photosensitive ingredients, then the imide-oligomer layer is to be patterned (as shown in FIG. 2B) by an additional photo-resist layer coated atop, which is patterned by a photolithography process, then etch the imide-oligomer layer with the photo-resist layer as an etching mask, and then removing the photo-resist layer. Thereby, an opening 322 is formed in the imide-oligomer layer and leaves the patterned metal circuit layer 310 exposed. After forming an opening in the imide-oligomer layer, the imide-oligomer layer can be cured by heating the imide-oligomer layer upto a temperature between 200° C. and 320° C. for more than 20 minutes and, preferably, between 240° C. and 300° C. for more than 1 hour or for more than 2 hours. So far, the patterned polymer layer 320 is formed. The patterned polymer layer 320 has its main purpose of protecting the patterned metal circuit layer 310.

Furthermore, if the thickness of polymer layer 320a is very thick, it can adopt multiple above-mentioned spin-on coating and curing processes, that is, a step of above-mentioned spin-on coating and curing processes is performed, followed by another step of above-mentioned spin-on coating and curing processes is further performed until the desired thickness of the polymer layer 320a is reached.

In contrast to the prior art that utilizes a curing temperature for curing polyimide higher than 350° C., the polymer layer 320a can be cured at a temperature lower than 320° C. Accordingly, the over-passivation process of present invention can reduce the occurrence of inter-metallic compound and can suppress the thermal budget. To a manufacturing process having a tight thermal budget, particularly for sub-hundred-nanometer devices, the stated method of forming a polymer layer in the present invention can meet the requirement more easily. In the over-passivation process of present invention, the patterned metal circuit layer 310 comprises Al layer formed by a sputtering process. In an alternative practice, the patterned metal circuit layer 310 can be either made of gold or copper formed by an electroplating process, as described below.

Figure 3A:
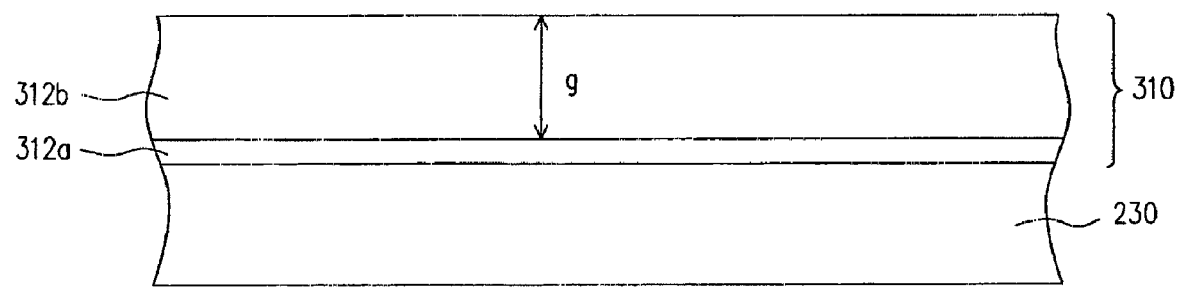
FIGS. 3A and 3B are cross-sectional representations of the detail metal layers of the patterned metal circuit line according to the first preferred embodiment of the present invention.
Figure 3B:
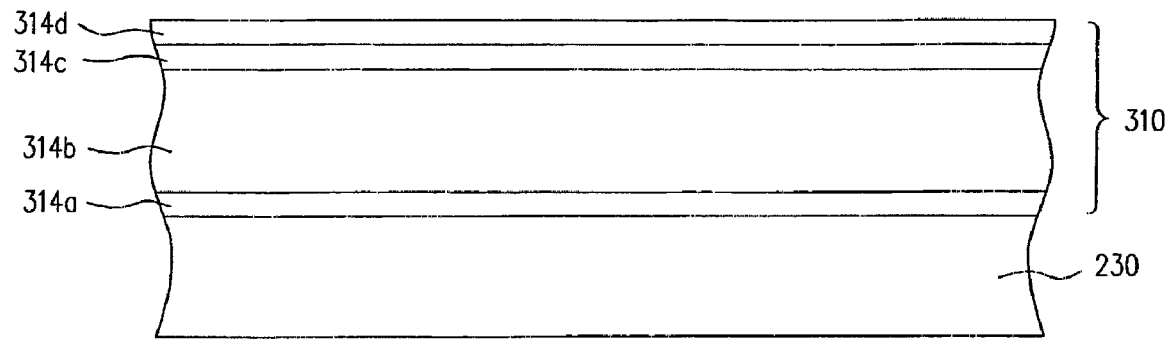

FIGS. 3A and 3B are the cross-sectional representations of the patterned metal circuit of the first preferred embodiment. The formation for the patterned metal circuit 310 comprises the following steps. First an adhesion/barrier layer 312a is formed over the connection pad 230 and the passivation layer 240 using a sputtering process, for example. A photoresist layer is subsequently deposited over the adhesion-barrier layer 312a and is further patterned to form an opening exposing the adhesion-barrier layer 312a. Following the above steps, a bulk metal layer 312b is formed over the adhesion/barrier layer 312a exposed by the opening in the photoresist layer using an electroplating process. After depositing the bulk metal layer 312b, the photoresist layer is removed. Next, using the patterned bulk metal layer 312b as the etching mask, the adhesion/barrier layer 312a uncovered by the bulk metal layer is etched away. So far, the patterned metal circuit layer 310 thus is formed.

In a case, the adhesion/barrier layer 312a may comprise chromium, a chromium-copper alloy, titanium, a titanium-tungsten alloy, titanium nitride, tantalum or tantalum nitride, for example. The bulk metal layer 312b may be a single metal layer and may have a thickness a1 thicker than 1 µm, and preferably between 2 µm and 30 µm, wherein the bulk metal layer 312b may comprise gold with greater than 90 weight percent, and, preferably, greater than 97 weight percent. Alternatively, a seed layer (not shown), such as gold, can be sputtered on the adhesion/barrier layer 312a, preferably comprising a titanium-tungsten alloy, and then the bulk metal layer 312b is electroplated on the seed layer.

In another case, the bulk metal layer 312b may be a single metal layer and may have a thickness a1 thicker than 1 micrometer, and preferably between 2 micrometers and 30 micrometers, wherein the bulk metal layer 312b may comprise silver with greater than 90 weight percent, and, preferably, greater than 97 weight percent. Alternatively, a seed layer (not shown), such as silver, can be sputtered on the adhesion/barrier layer 312a and then the bulk metal layer 312b is electroplated on the seed layer, wherein the adhesion/barrier layer 312a may comprise chromium, a chromium-copper alloy, titanium, a titanium-tungsten alloy, titanium nitride, tantalum or tantalum nitride, for example.

In another case, the bulk metal layer 312b may be a single metal layer and may have a thickness a1 thicker than 1 micrometer, and preferably between 2 micrometers and 30 micrometers, wherein the bulk metal layer 312b may comprise copper with greater than 90 weight percent, and, preferably, greater than 97 weight percent. Alternatively, a seed layer (not shown), such as copper, can be sputtered on the adhesion/barrier layer 312a, preferably comprising titanium, chromium or a chromium-copper alloy, and then the bulk metal layer 312b is electroplated on the seed layer, wherein the adhesion/barrier layer 312a may comprise other materials, such as a titanium-tungsten alloy, titanium nitride, tantalum or tantalum nitride, for example. Alternatively, the adhesion/barrier layer 312a may be formed by sputtering a chromium layer and then sputtering a chromium-copper layer on the chromium layer.

In another case, the bulk metal layer 312b may be a single metal layer and may have a thickness a1 thicker than 1 micrometer, and preferably between 2 micrometers and 30 micrometers, wherein the bulk metal layer 312b may comprise platinum with greater than 90 weight percent, and, preferably, greater than 97 weight percent. Alternatively, a seed layer (not shown), such as platinum, can be sputtered on the adhesion/barrier layer 312a and then the bulk metal layer 312b is electroplated on the seed layer, wherein the adhesion/barrier layer 312a may comprise chromium, a chromium-copper alloy, titanium, a titanium-tungsten alloy, titanium nitride, tantalum or tantalum nitride, for example.

In another case, the bulk metal layer 312b may be a single metal layer and may have a thickness a1 thicker than 1 micrometer, and preferably between 2 micrometers and 30 micrometers, wherein the bulk metal layer 312b may comprise palladium with greater than 90 weight percent, and, preferably, greater than 97 weight percent. Alternatively, a seed layer (not shown), such as palladium, can be sputtered on the adhesion/barrier layer 312a and then the bulk metal layer 312b is electroplated on the seed layer, wherein the adhesion/barrier layer 312a may comprise chromium, a chromium-copper alloy, titanium, a titanium-tungsten alloy, titanium nitride, tantalum or tantalum nitride, for example.

In another case, the bulk metal layer 312b may be a single metal layer and may have a thickness a1 thicker than 1 micrometer, and preferably between 2 micrometers and 30 micrometers, wherein the bulk metal layer 312b may comprise rhodium with greater than 90 weight percent, and, preferably, greater than 97 weight percent. Alternatively, a seed layer (not shown), such as rhodium, can be sputtered on the adhesion/barrier layer 312a and then the bulk metal layer 312b is electroplated on the seed layer, wherein the adhesion/barrier layer 312a may comprise chromium, a chromium-copper alloy, titanium, a titanium-tungsten alloy, titanium nitride, tantalum or tantalum nitride, for example.

In another case, the bulk metal layer 312b may be a single metal layer and may have a thickness a1 thicker than 1 micrometer, and preferably between 2 micrometers and 30 micrometers, wherein the bulk metal layer 312b may comprise ruthenium with greater than 90 weight percent, and, preferably, greater than 97 weight percent. Alternatively, a seed layer (not shown), such as ruthenium, can be sputtered on the adhesion/barrier layer 312a and then the bulk metal layer 312b is electroplated on the seed layer, wherein the adhesion/barrier layer 312a may comprise chromium, a chromium-copper alloy, titanium, a titanium-tungsten alloy, titanium nitride, tantalum or tantalum nitride, for example.

In another case, the adhesion/barrier layer 312a may comprise titanium, a titanium-tungsten alloy, titanium nitride, tantalum or tantalum nitride, for example. Alternatively, the adhesion/barrier layer 312a may be formed by sputtering a chromium layer and then sputtering a chromium-copper layer on the chromium layer. The bulk metal layer 312b may be multiple metal layers, such as first and second metal layers, the second metal layer being on the first metal layer. The first metal layer may have a thickness a2 thicker than 1 µm, and preferably between 2 micrometers and 30 micrometers, wherein the first metal layer may comprise copper with greater than 90 weight percent, and, preferably, greater than 97 weight percent. The second metal layer may comprise nickel, for example, and may have a thickness thicker than 1 micrometer, and preferably between 2 micrometers and 5 micrometers. Alternatively, a seed layer (not shown), such as copper, can be sputtered on the adhesion/barrier layer 312a, then the first metal layer is electroplated on the seed layer, and then the second metal layer is electroplated on the first metal layer.

In another case, as shown in FIG. 3B, the adhesion/barrier layer 314a may comprise titanium, a titanium-tungsten alloy, titanium nitride, tantalum or tantalum nitride, for example. Alternatively, the adhesion/barrier layer 314a may be formed by sputtering a chromium layer and then sputtering a chromium-copper layer on the chromium layer. The bulk metal layer may be multiple metal layers, such as a first metal layer 314b, a second metal layer 314c and a third metal layer 314d, the second metal layer 314c being on the first metal layer 314b, and the third metal layer 314d being on the second metal layer 314c. The first metal layer 314b may have a thickness a2 thicker than 1 micrometer, and preferably between 2 micrometers and 30 micrometers, wherein the first metal layer 352 may comprise copper with greater than 90 weight percent, and, preferably, greater than 97 weight percent. The second metal layer 314c may comprise nickel, for example, and may have a thickness thicker than 1 micrometer, and preferably between 2 micrometers and 5 micrometers. The third metal layer 314d may be made of gold, for example, and may have a thickness thicker than 100 angstroms, and preferably between 10 angstroms and 2000 angstroms. Alternatively, a seed layer (not shown), such as copper, can be sputtered on the adhesion/barrier layer 314a, then the first metal layer 314b is electroplated on the seed layer, then the second metal layer 314c is electroplated on the first metal layer 314b, and then the third metal layer 314d is electroplated on the second metal layer 314c.

As shown in FIG. 3B, the formation for the patterned metal circuit 310 comprises the following steps. First an adhesion/barrier layer 314a is formed over the connection pad 230 and the passivation layer 240 using a sputtering process, for example. A photoresist layer is subsequently deposited over the adhesion-barrier layer 312a and is further patterned to form an opening exposing the adhesion-barrier layer 312a. Following the above steps, the above-mentioned first metal layer 314b is formed over the adhesion/barrier layer 314a exposed by the opening in the photoresist layer using an electroplating process; next, the above-mentioned second metal 314c is electroplated on the first metal layer 314b; next, the above-mentioned third metal 314d is electroplated on the second metal layer 314c. After depositing the first, second and third metal layers 314b, 314c and 314d, the photoresist layer is removed. Next, using the patterned first metal layer 314b as the etching mask, the adhesion/barrier layer 314a uncovered by the first metal layer 314b is etched away. So far, the patterned metal circuit layer 310 thus is formed.

It is to be noted that in the over-passivation process of the present invention, the curing process of the patterned polymer layer 320 is done at a low temperature, such as one below 320° C. Therefore, we can reduce the diffusion of the aluminum atoms that constitutes the body of the connection pad 230 of the circuit structure of FIGS. 3A and 3B. The polyimide is cured with a temperature cycle or profile by heating the imide-oligomer layer upto a peak temperature between 200° C. and 320° C., and staying at about peak temperature for more than 20 minutes. The peak temperature is preferably between 240° C. and 300° C. for more than 1 hour or 2 hours to cure the imide-oligomer layer. If the temperature over 320° C. is applied in the curing temperature cycle or profile, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better at less than 50 ppm. In some applications, nitrogen ambient with forming gas (comprising hydrogen) can be used. The chance that the Aluminum atoms passes the adhesion-barrier layer 312a or 314a and enters the bulk metal layer 312b or 314b is thus lowered. Occurrence of the inter-metallic compound thus is reduced.

Because the invention cures the patterned polymer layer 320 at a lower temperature, it reduces the thermal budget of over-passivation process. The thickness of adhesion-barrier layer 312a or the adhesion-barrier layer 314a can also be reduced accordingly. In comparison to the prior art, the thickness of adhesion-barrier layer 312a or adhesion-barrier layer 314a will be thinner. Such a trait not only reduces the production cost, but also enhances the quality of the electrical signal that passes through.

Second Embodiment

Figure 4:
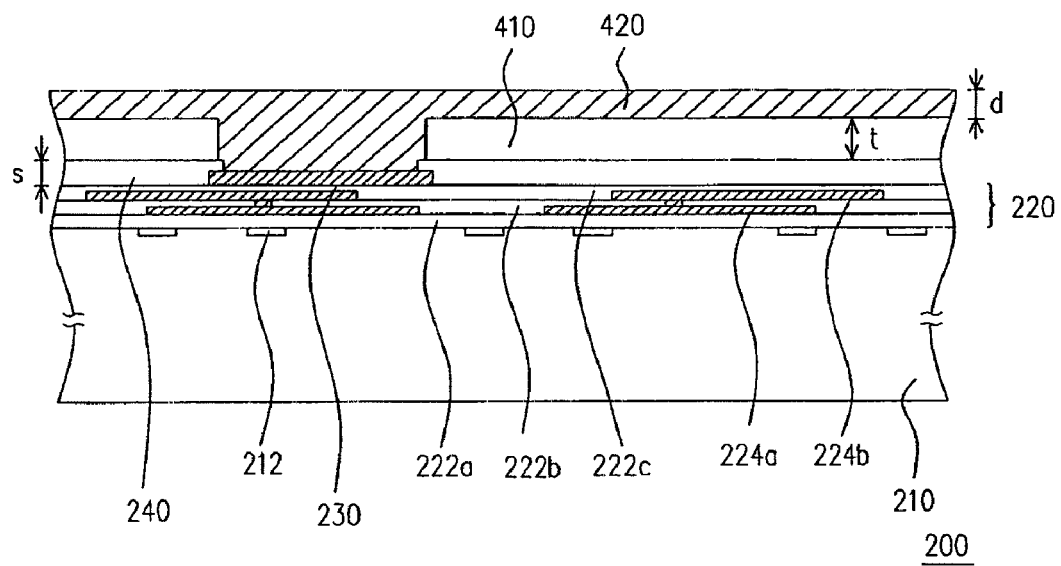
FIG. 4 is cross-sectional representations of semiconductor chips formed by the invented process according to the second preferred embodiment of the present invention.

FIG. 4 is the cross-sectional representation of the over-passivation process of the second preferred embodiment of present invention. Some reference numbers appearing on the second embodiment are the same as those of the first preferred embodiment; in such case it means the elements referred by both embodiments are the same or similar.

In the second preferred embodiment, a patterned polymer layer 410 is first formed on the passivation layer 240, and a patterned metal circuit layer 420 is subsequently formed over the patterned polymer layer 410. More specifically, the step of forming the patterned polymer layer 410, as is briefly depicted above, comprises first forming an imide-oligomer layer, precursor layer, over the passivation layer 240; followed by curing. The polyimide is cured with a temperature cycle by heating the imide-oligomer layer upto a peak temperature between 200° C. and 320° C., and staying at about peak temperature for more than 20 minutes. The peak temperature is preferably between 240° C. and 300° C. for more than 1 hour or 2 hours to cure the imide-oligomer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used. It should be noticed that if the imide-oligomer layer comprises photo-sensitive ingredients, the imide-oligomer layer can be patterned (as shown in FIG. 4) directly by a photolithography process. If the imide-oligomer layer only contains non-photosensitive ingredients, then the imide-oligomer layer is to be patterned (as shown in FIG. 4) by an additional photo-resist layer coated atop, which is patterned by a photolithography process, then etch the imide-oligomer layer with the photo-resist layer as an etching mask, and then removing the photo-resist layer. Thereby, an opening 322 is formed in the imide-oligomer layer and leaves the patterned metal circuit layer 230 exposed. After forming an opening in the imide-oligomer layer, the imide-oligomer layer can be cured. The polyimide is cured with a temperature cycle by heating the imide-oligomer layer upto a peak temperature between 200° C. and 320° C., and staying at about peak temperature for more than 20 minutes. The peak temperature is preferably between 240° C. and 300° C. for more than 1 hour or 2 hours to cure the imide-oligomer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used. So far, the patterned polymer layer 410 is formed.

It is to be noted that the material used to constitute the patterned polymer layer 410 comprises a polyimide layer, and the thickness t of patterned polymer layer 410 is thicker than 1 micrometer, and preferably between 2 micrometers and 10 micrometers. Furthermore, the patterned metal circuit 420 may have similar structure to the above-mentioned metal layer 310. The processes to manufacture the patterned metal circuit 420 may be similar to the above-mentioned process to manufacture the metal layer 310, as shown in FIGS. 3A and 3B.

Third Embodiment

FIG. 4 is the cross-sectional representation of the over-passivation process of the second preferred embodiment of present invention. Some reference numbers appearing on the second embodiment are the same as those of the first preferred embodiment; in such case it means the elements referred by both embodiments are the same or similar.

Figure 5A:
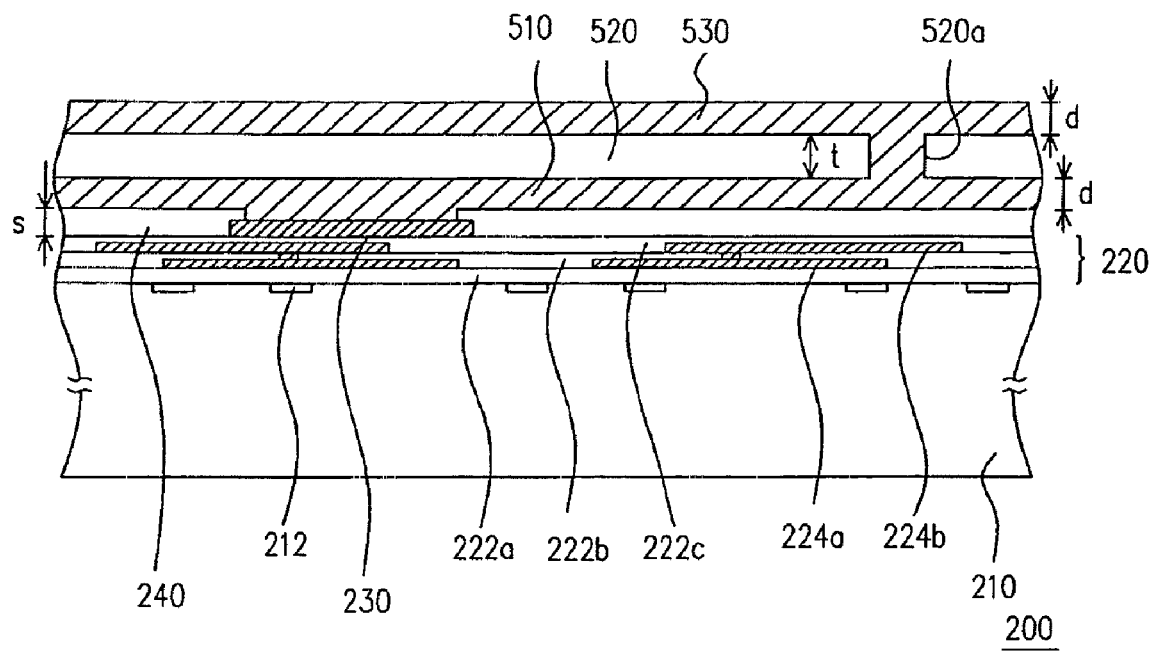
FIG. 5 is a cross-sectional representation of a semiconductor chip formed by the invented process according to the third preferred embodiment of the present invention.
Figure 5B:
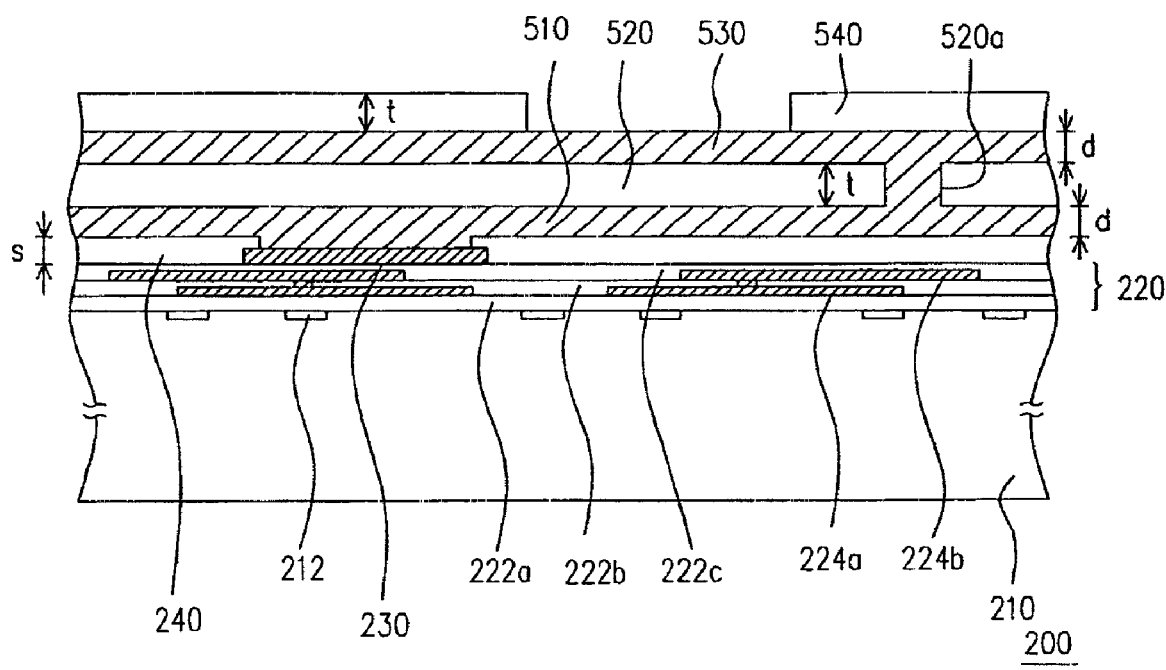

FIGS. 5A and 5B are the cross-sectional representations of a over-passivation structure of a third preferred embodiment of the present invention. Some reference numbers appearing on the third embodiment are the same as those of the first preferred embodiment; in such a case it means the elements referred by both embodiments are the same or similar.

Referring to FIG. 5A, the over-passivation process comprises the following steps. First, a chip 200 is provided. Then a patterned metal circuit 510 is formed on the passivation layer 240. Hereafter a patterned polymer layer 520 is formed on the patterned metal circuit 510; the material used for the patterned polymer layer comprises polyimide. The steps of forming the patterned polymer layer 520 comprises forming an imide-oligomer layer on the patterned metal circuit layer 510, followed by forming an opening in the imide-oligomer layer using a photolithography process optionally plus an etching process, followed by heating the imide-oligomer layer upto a temperature between 200° C. and 320° C. for more than 20 minutes and, preferably, between 240° C. and 300° C. for more than 1 hour or for more than 2 hours to cure imide-oligomer layer into a stable polymer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used. Still afterwards, another patterned metal circuit 530 is formed over the patterned metal circuit layer 510 and the patterned polymer layer 520. The patterned metal circuit 530 is electrically connected to the patterned metal circuit layer 510 through the opening 520a.

It is to be noted that the thickness t of the patterned polymer layer 520 is thicker than 1 micrometer, and, preferably, between 2 micrometers and 10 micrometers. Besides, the thickness d of the patterned metal circuit layers 510 and 530 is thicker than 1 micrometer and, preferably, between 2 micrometers and 30 micrometers. The patterned metal circuit layers 510 and 530 may comprise aluminum, gold, copper or other material discussed in the first embodiment; the processes of manufacturing the patterned metal circuit layers 510 and 530 may be referred to the process of manufacturing the patterned metal circuit layer 310 as described in first preferred embodiment.

The main purpose of the third preferred embodiment is to form a multi-layer circuit structure over the passivation layer 230. In such multi-layer circuit structure, the patterned polymer layer 520 is positioned between the patterned metal circuit layers 510 and 530; said patterned polymer layer 520 is cured upto a temperature below 320° C., leading the thermal budget of the process to be reduced.

Please refer to FIG. 5B, in order to provide better protection for the metal circuit layer 530, the over-passivation process of the second preferred embodiment can further comprise a patterned polymer layer 540, deposited over the patterned metal circuit 530; said polymer layer has openings to expose the patterned metal circuit 530; the material used to constitute the second patterned polymer layer 540 comprises polyimide; the thickness t of first patterned polymer layer 540 may be thicker than 1 micrometer, and, preferably, between 2 micrometers and 10 micrometers. The steps of forming the patterned polymer layer 540 comprises forming an imide-oligomer layer on the patterned metal circuit layer 530, followed by forming an opening in the imide-oligomer layer using a photolithography process optionally plus an etching process, followed by heating the imide-oligomer layer upto a temperature between 200° C. and 320° C. for more than 20 minutes and, preferably, between 240° C. and 300° C. for more than 1 hour or for more than 2 hours to cure imide-oligomer layer into a stable polymer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used.

Fourth Embodiment

Figure 6:
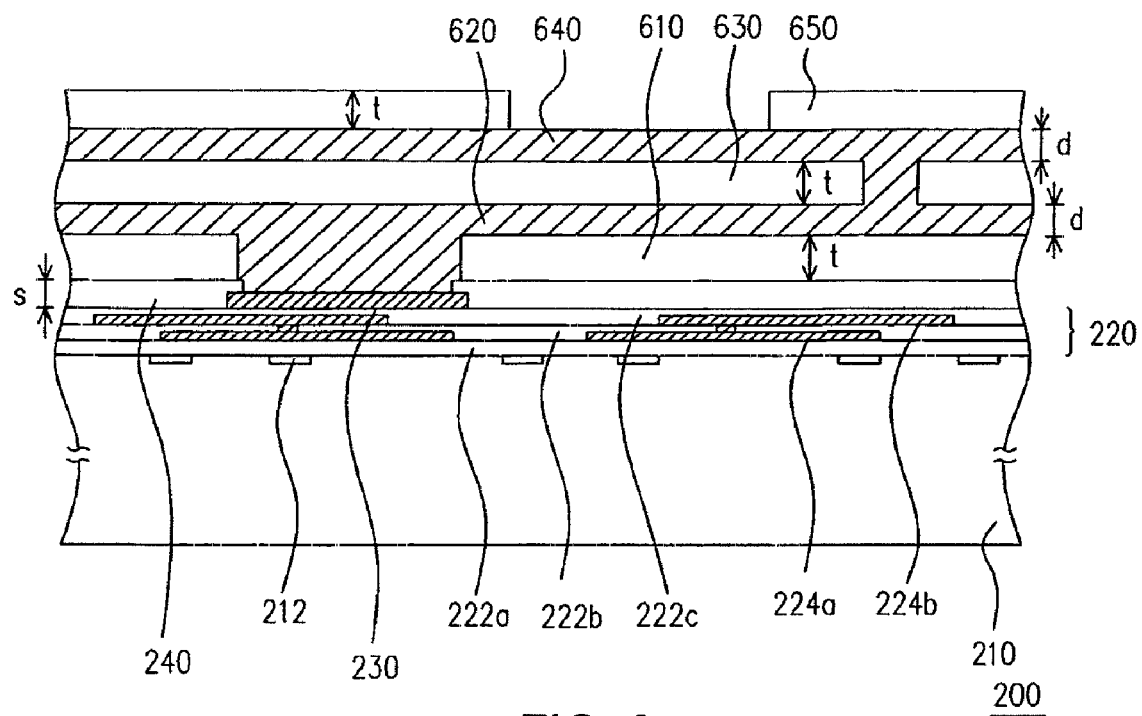
FIG. 6 is a cross-sectional representation of a semiconductor chip formed by the invented process according to the fourth preferred embodiment of the present invention.

FIG. 6 is the cross-sectional representation of a over-passivation structure of a fourth preferred embodiment of the present invention. Some reference numbers appearing on the forth embodiment are the same as those of the third preferred embodiment; in such a case it means the elements referred by both embodiments are the same or similar.

In the fourth preferred embodiment, a polymer layer 610 is first formed and patterned over the passivation layer 240. Following the above steps, a patterned metal circuit layer 620 is formed on the patterned polymer layer 610. The steps of forming the patterned polymer layer 610 comprises forming an imide-oligomer layer over the passivation layer 240, followed by forming an opening in the imide-oligomer layer using a photolithography process optionally plus an etching process, followed by curing. The polyimide is cured with a temperature cycle by heating the imide-oligomer layer upto a peak temperature between 200° C. and 320° C., and staying at about peak temperature for more than 20 minutes. The peak temperature is preferably between 240° C. and 300° C. for more than 1 hour or 2 hours to cure the imide-oligomer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used. Metal diffusion phenomenon between the patterned metal circuit layer 620 and connection pad will not happen during the process of curing the imide-oligomer layer because the process of curing the imide-oligomer layer takes place before the patterned metal circuit layer 620 is formed. Therefore, we can even set an alternative curing temperature higher than 320° C., such as between 320° C. and 420° C., to cure the imide-oligomer for more than 20 minutes into the stable polyimide layer 610.

The fourth preferred embodiment discloses forming multi-layer structure over the passivation layer 230. The process of manufacturing the multi-layer structure basically follows the sequential order depicted as the following: the patterned polymer layer 610 is formed over the passivation layer 240, then the patterned metal circuit layer 620 is formed over the patterned polymer layer 610. Thereafter, the patterned polymer layer 630, the patterned metal circuit layer 640, and the patterned polymer layer 650 are sequentially formed over the IC chip.

The patterned metal circuit layers 620 and 640 may comprise aluminum, gold, copper or other material discussed in the first embodiment; the processes of manufacturing the patterned metal circuit layers 620 and 640 may be referred to the process of manufacturing the patterned metal circuit layer 310 as described in first preferred embodiment. It should be noted that at least one or even more of the patterned polymer layer 610, or the patterned polymer layer 630, or the patterned polymer layer 650 can be cured at a temperature between 200° C. and 320° C. for more than 20 minutes and, preferably, between 240° C. and 300° C. for more than 1 hour or for more than 2 hours. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used.

Fifth Embodiment

Figure 7:
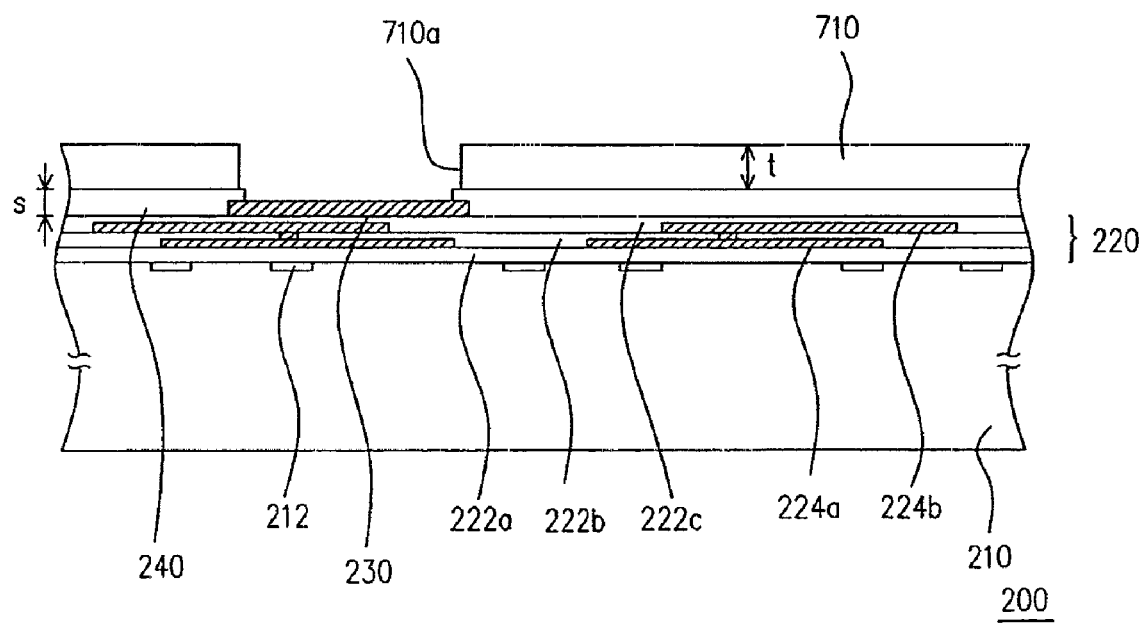
FIG. 7 is a cross-sectional representation of a semiconductor chip formed by the invented process according to the fifth preferred embodiment of the present invention.

Please refer to FIG. 7, which is a cross-sectional representation of a semiconductor chip or wafer of a fifth embodiment of the present invention. The process of forming polymer layer over the IC chip comprises the following steps. First, a chip 200 is provided. Then a polymer layer 710 comprising polyimide can be deposited over the passivation layer 240 of the semiconductor chip or wafer 200 by forming an imide-oligomer layer over the passivation layer 240 using a spin-coating process, followed by forming an opening in the imide-oligomer layer using a photolithography process optionally plus an etching process, followed by curing. The polyimide is cured with a temperature cycle by heating the imide-oligomer layer upto a peak temperature between 200° C. and 320° C., and staying at about peak temperature for more than 20 minutes. The peak temperature is preferably between 240° C. and 300° C. for more than 1 hour or 2 hours to cure the imide-oligomer layer. If the temperature over 320° C. is applied in the curing temperature cycle, the period of time for temperature over 320° C. should be shorter than 45 minutes, or 30 minutes, and preferably shorter than 20 minutes. The polyimide curing is performed in a nitrogen ambient with the oxygen content less than 2,000 ppm, or 500 ppm, preferred less than 100 ppm, and even better less than 50 ppm. In some applications, nitrogen ambient with forming gas (comprising hydrogen) can be used. The patterned polymer layer 710 may be thicker than 1 micrometer, and, preferably, between 2 micrometers and 10 micrometers. Furthermore, if the thickness of polymer layer 710 is required to be very thick, we can adopt multiple above-mentioned spin-on coating and curing processes, that is, a step of above-mentioned spin-on coating and curing processes is performed, followed by another step of above-mentioned spin-on coating and curing processes is further performed until the desired thickness of the polymer layer 710 is reached.

It is worth mentioning herewith that through series of further experiments on the curing temperature, one can identify the optimized curing temperature, which can be more effective on reducing the thermal budget and enhancing the quality of the over-passivation layer.

In summary, the over-passivation process depicted above and the process that forms polymer layer over the IC chip, depicted in the present invention, have the following advantages:

1. In contrast to the prior arts whose curing temperature is higher than 350° C., the polymer layer over the passivation layer can be cured below 320° C. Its merit is: the over-passivation process of the present invention not only has the efficacy of reducing the occurrence of inter-metallic compound, but also enhances the quality of electrical signal that passes through.

2. Compare to the prior arts, the over-passivation process of present invention can reduce the thermal budget of the entire manufacturing process. Such a trait not only enhances the stability of chip structure, but also decreases the occurrence of the other problems that are associated with temperature.

3. Compare to the prior art, the present invention discloses the thickness of the adhesion/barrier layer can be made thinner. This characteristic can result in a cost reduction of the manufacturing process and enhanced a signal quality of the IC chip.

It will be apparent to those skilled in the art that various modifications and variations can be made to the structure of the present invention without departing from the scope or spirit of the invention. For example, it is possible that the wire-bonding pad is not electrically connected to the testing pad or to the bump pad. In view of the foregoing, it is intended that the present invention cover modifications and variations of this invention provided they fall within the scope of the following claims and their equivalents.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a semiconductor chip, comprising:
    providing a silicon substrate, a first circuit layer over said silicon substrate, a second circuit layer over said silicon substrate and said first circuit layer, a dielectric layer between said first and second circuit layers, and a passivation layer over said silicon substrate, said first and second circuit layers and said dielectric layer, wherein said passivation layer comprises a nitride layer;
    forming a metal layer over said passivation layer;
    forming a photoresist layer on said metal layer, wherein an opening in said photoresist layer exposes a region of said metal layer;
    after said forming said photoresist layer, electroplating a copper layer on said region;
    after said electroplating said copper layer, removing said photoresist layer;
    after said removing said photoresist layer, removing said metal layer not under said copper layer;
    after said removing said metal layer not under said copper layer, forming a first polyimide layer over said copper layer; and
    curing said first polyimide layer with a temperature profile having a peak temperature between 200 and 320 degrees Celsius.

2. The method of claim 1, wherein said forming said metal layer comprises sputtering a titanium-containing layer over said passivation layer.

3. The method of claim 1, further comprising said curing said first polyimide layer in an ambient comprising nitrogen.

4. The method of claim 1, further comprising said curing said first polyimide layer in an ambient comprising less than 500 ppm oxygen.

5. The method of claim 1, further comprising said curing said first polyimide layer in an ambient comprising hydrogen.

6. The method of claim 1, wherein said curing said first polyimide layer is performed at said peak temperature within 10 degrees Celsius deviation for longer than 20 minutes.

7. The method of claim 1, further comprising said curing said first polyimide layer with said temperature profile having said peak temperature between 240 and 300 degrees Celsius.

8. The method of claim 1 further comprising forming a second polyimide layer on said passivation layer, followed by said forming said metal layer further on said second polyimide layer.

9. The method of claim 1 further comprising providing a poly-to-poly capacitor in or on said silicon substrate.

10. The method of claim 1 further comprising said electroplating said copper layer to a thickness between 2 and 30 micrometers.

11. The method of claim 1, wherein said nitride layer has a thickness between 0.2 and 1.2 micrometers.

12. A method for forming a semiconductor chip, comprising:
    providing a silicon substrate, a first circuit layer over said silicon substrate, a second circuit layer over said silicon substrate and said first circuit layer, a dielectric layer between said first and second circuit layers, a metal pad over said silicon substrate, and a passivation layer over said silicon substrate, said first and second circuit layers and said dielectric layer, wherein said passivation layer comprises a nitride layer, wherein an opening in said passivation layer is over a contact point of said metal pad, and said contact point is at a bottom of said opening in said passivation layer;
    forming a metal layer on said contact point and over said passivation layer;
    forming a photoresist layer on said metal layer, wherein an opening in said photoresist layer exposes a region of said metal layer;
    after said forming said photoresist layer, electroplating a copper layer on said region;
    forming a nickel layer on said copper layer;
    after said forming said nickel layer, removing said photoresist layer;
    after said removing said photoresist layer, removing said metal layer not under said copper layer;
    after said removing said metal layer not under said copper layer, forming a polyimide layer over said nickel layer; and
    curing said polyimide layer with a temperature profile having a peak temperature between 200 and 320 degrees Celsius.

13. The method of claim 12 further comprising said curing said polyimide layer with said temperature profile having said peak temperature between 240 and 300 degrees Celsius.

14. The method of claim 12 further comprising said forming said nickel layer to a thickness greater than 1 micrometer.

15. The method of claim 12, wherein said forming said nickel layer comprises an electroplating process.

16. The method of claim 12, wherein said nitride layer has a thickness between 0.2 and 1.2 micrometers.

17. A method for forming a semiconductor chip, comprising:
    providing a silicon substrate, a first circuit layer over said silicon substrate, a second circuit layer over said silicon substrate and said first circuit layer, a dielectric layer between said first and second circuit layers, a metal pad over said silicon substrate, and a passivation layer over said silicon substrate, said first and second circuit layers and said dielectric layer, wherein said passivation layer comprises a nitride layer, wherein an opening in said passivation layer is over a contact point of said metal pad, and said contact point is at a bottom of said opening in said passivation layer;

forming a metal layer on said contact point and over said passivation layer;

forming a photoresist layer on said metal layer, wherein an opening in said photoresist layer exposes a region of said metal layer;

after said forming said photoresist layer, electroplating a copper layer on said region;

forming a nickel layer on said copper layer;

forming a gold layer over said nickel layer;

after said forming said gold layer, removing said photoresist layer;

after said removing said photoresist layer, removing said metal layer not under said copper layer;

after said removing said metal layer not under said copper layer, forming a polyimide layer over said gold layer; and curing said polyimide layer with a temperature profile having a peak temperature between 200 and 320 degrees Celsius.

18. The method of claim 17 further comprising said curing said polyimide layer with said temperature profile having said peak temperature between 240 and 300 degrees Celsius.

19. The method of claim 17 further comprising said forming said gold layer to a thickness between 10 and 2000 angstroms.

20. The method of claim 17, wherein said nitride layer has a thickness between 0.2 and 1.2 micrometers.

* * * * *